(12) United States Patent
Chen

(10) Patent No.: US 9,069,035 B2
(45) Date of Patent: Jun. 30, 2015

(54) PREDICTING LED PARAMETERS FROM ELECTROLUMINESCENT SEMICONDUCTOR WAFER TESTING

(76) Inventor: Dong Chen, Tucson, AZ (US)

( * ) Notice: Subject to any disclaimer, the term of this patent is extended or adjusted under 35 U.S.C. 154(b) by 610 days.

(21) Appl. No.: 13/333,433

(22) Filed: Dec. 21, 2011

(65) Prior Publication Data

US 2013/0046496 A1 Feb. 21, 2013

Related U.S. Application Data

(60) Provisional application No. 61/525,770, filed on Aug. 21, 2011.

(51) Int. Cl.
| | |
|---|---|
| *G06F 19/00* | (2011.01) |
| *G01R 27/00* | (2006.01) |
| *G01R 31/26* | (2014.01) |
| *H05B 31/00* | (2006.01) |
| *F21V 8/00* | (2006.01) |
| *F21Y 103/00* | (2006.01) |
| *G01R 31/265* | (2006.01) |

(52) U.S. Cl.
CPC ......... *G01R 31/2648* (2013.01); *F21V 2008/00* (2013.01); *H05B 2206/00* (2013.01); *H05B 31/00* (2013.01); *F21Y 2103/00* (2013.01); *G01R 31/2656* (2013.01)

(58) Field of Classification Search
CPC .. G01R 31/088; G01R 31/2831; G01R 31/08; G01R 31/085; G01R 31/2648; G01R 31/021; G01R 31/025; G01N 27/041; H01L 22/14; H01L 22/34; H02H 7/26; H04L 12/10

USPC ......... 324/765, 754, 762, 525, 522, 708, 719, 324/724; 483/17, 14

See application file for complete search history.

(56) References Cited

U.S. PATENT DOCUMENTS

| | | | |
|---|---|---|---|
| 6,930,502 B2 * | 8/2005 | Lee et al. ................. | 324/754.26 |
| 2004/0138865 A1 * | 7/2004 | Hsiao et al. ................... | 703/14 |
| 2007/0075712 A1 * | 4/2007 | Fitzgerald et al. ............ | 324/715 |
| 2013/0046496 A1 * | 2/2013 | Chen ............................. | 702/65 |

OTHER PUBLICATIONS

Shah, et. al. "Experimental analysis and theoretical model for anomalously high ideality factors (n>>2.0) in AlGaN/GaN p-n junction diodes", vol. 94, No. 4, Journal of Applied Physics, Aug. 15, 2003.*

LUMILEDS Lightning, LLC, "Advanced Electrical Design Models", Application Brief AB20-3A, Nov. 2002.*

(Continued)

*Primary Examiner* — Mohamed Charioui
*Assistant Examiner* — Seokjin Kim
(74) *Attorney, Agent, or Firm* — Antonio R. Durando

(57) ABSTRACT

A diode model and conductive-probe measurements taken at the wafer lever are used to predict the characterization parameters of a semiconductor device manufactured from the wafer. A current-voltage curve (I-V) model that expresses a current-voltage relationship as a function of resistance, ideality factor, and reverse saturation current is fitted to a number of conductive-probe measurement data. The current-voltage curve (I-$V_d$) for the device is then estimated by subtracting from the (I-V) model the product of current times the resistance produced by fitting the (I-V) model.

21 Claims, 9 Drawing Sheets

(56) References Cited

OTHER PUBLICATIONS

Shah, et. al., "Experimental analysis and theoretical model for anomalously high ideality factors (n>>2.0) in AlGaN/GaN p-n Junction diodes", vol. 94, No. 4, Journal of Applied Physics, Aug. 15, 2003.*

LUMILEDS Lighting, LLC, "Advanced Electrical Design Models", Application brief AB20-3A, Nov. 2002.*
Jay M. Shaw et al., "Experimental Analysis and Theoretical Model for Anomalously High Ideality Factors (N >> 2.0) in Algan/GaN p-n Junction Diodes," Journal of Applied Physics, vol. 94, No. 4, at 2627-2630, Aug. 15, 2003.
LUMILEDS Lighting, LLC, Publication No. AB20-3A, Nov. 2002.

* cited by examiner

PREDICTING LED PARAMETERS FROM ELECTROLUMINESCENT SEMICONDUCTOR WAFER TESTING

RELATED APPLICATIONS

This application is based on and claims the priority of U.S. Provisional Application Ser. No. 61/525,770, filed Aug. 21, 2011.

BACKGROUND OF THE INVENTION

1. Field of the Invention

This invention pertains to the general field of testing of light-emitting materials. In particular, it pertains to a method and related apparatus for predicting the electroluminescent properties of individual light emitting diodes (LEDs) from measurements conducted on the semiconductor waver from which the LEDs are produced.

2. Description of the Prior Art

The characterization of light-emitting semiconductor structures at the wafer-level (i.e., after forming the p-n junction and the active quantum well layers, but prior to the chip processing steps) is typically carried out with a non-destructive wafer probe. Parameters such as the current-voltage curve, the diode ideality factor, its reverse saturation current and its spectral properties at the device level are of critical importance for the characterization of the LEDs manufactured from wafers. To that end, a conductive probe is temporarily placed in contact with the top of the epi-wafer (p-GaN) layer while another electrode contacts the n-GaN layer through either the edge of the wafer or through other means that allow access to the n-GaN layer. Such typical layout is illustrated in FIG. 1. When energized, the conductive probe, the semiconductor p-n junction structure on the wafer and the electrode form a temporary light-emitting device. By injecting a known current into the junction, light will emit and the spectral properties and their relationship with electrical properties can be measured and characterized.

Thus, one of the objectives of using probes to characterize light-emitting structures on a semiconductor wafer is to predict both the optical and the electrical properties at the device level after the wafer has been processed to produce LEDs. However, due to factors such as the difference in geometry and in the electrical contact methods and configurations, the parameters measured by a probe on wafer will normally differ from those measured on a device produced from it. For example, at the device level the electrodes are deposited permanently on device layers, as illustrated in FIG. 2, thereby producing a well defined current pass-channel. At the wafer level, where the probe is only mechanically pressed with a predetermined loading force against the surface of the wafer, the roughness of both probe and wafer surfaces produce a contact resistance that is not present in the individual device where the p-electrode and n-electrodes are formed onto respective device layers. Also, the distance between the two electrodes, which is fixed for device measurements, changes from location to location during wafer measurements with a corresponding change in the current channel position and length, as can be understood from FIG. 3.

Therefore, there remains a need for a wafer testing method that enables the reliable prediction of the optical and electrical characteristics of the LEDs produced from the wafer. This invention describes an approach that has shown reliable and repeatable results to that end.

BRIEF SUMMARY OF THE INVENTION

The invention lies in the general idea of using a diode model and conductive-probe measurements taken at the wafer lever to predict the characterization parameters of a semiconductor device manufactured from the wafer by removing the serial resistance contribution from the wafer tests. In particular, a current-voltage curve (I-V) model that expresses the current-voltage relationship as a function of resistance, the ideality factor, and the reverse saturation current is fitted to a number of conductive-probe measurement data. Then, the current-voltage curve (I-$V_d$) for the device is estimated by subtracting from the I-V model the product of current times the resistance produced by the fitting step.

In one embodiment of the invention the resistance is assumed constant, which enables the characterization of the wafer I-V model curve and the corresponding resistance with only three measurement data points. The device I-V curve (I-$V_d$) is then obtained simply by subtracting the product of current times resistance at each point. In another embodiment the resistance as a function of current is calculated numerically as the slope of the I-V model curve derived from the measurement data. The resistance-versus-current model, fitted to the data so generated, and the I-V model are then processed together to yield directly the current-voltage curve I-$V_d$, the ideality factor and the reverse saturation for the device.

Various other aspects and advantages of the invention will become clear from the description that follows and from the novel features particularly recited in the appended claims. Therefore, to the accomplishment of the objectives described above, this invention consists of the features hereinafter illustrated in the drawings, fully described in the detailed description of the preferred embodiments, and particularly pointed out in the claims. However, such drawings and description disclose only some of the various ways in which the invention may be practiced.

DETAILED DESCRIPTION OF THE INVENTION

Figure 4:
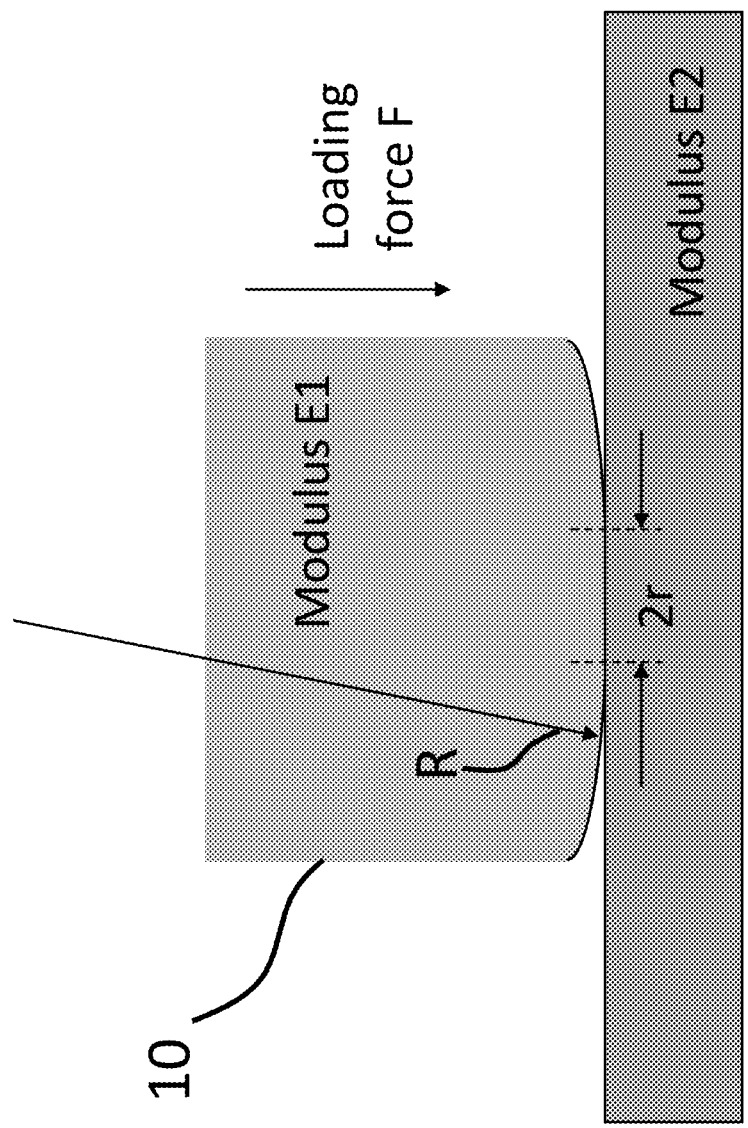
FIG. 4 illustrates the probe with a spherical-shape tip used during the development work that produced the present invention.

In order to improve control over the contact area of the probe for light emitting wafer tests, a shaped and polished probe is preferably used. Referring to the figures, wherein like parts are referenced with the same numerals and symbols, FIG. 4 shows the probe 10 with a spherical-shape tip used during the development of the present invention. For given probe and wafer materials, the contact area is a function of the loading force F and the radius of curvature R of the probe tip (i.e., the shape of the contact surface). Therefore, by controlling the shape of the probe and the loading force, it is possible to adjust the radius r of the contact area within a range from a few micrometers to thousands of micrometers.

Figure 1:
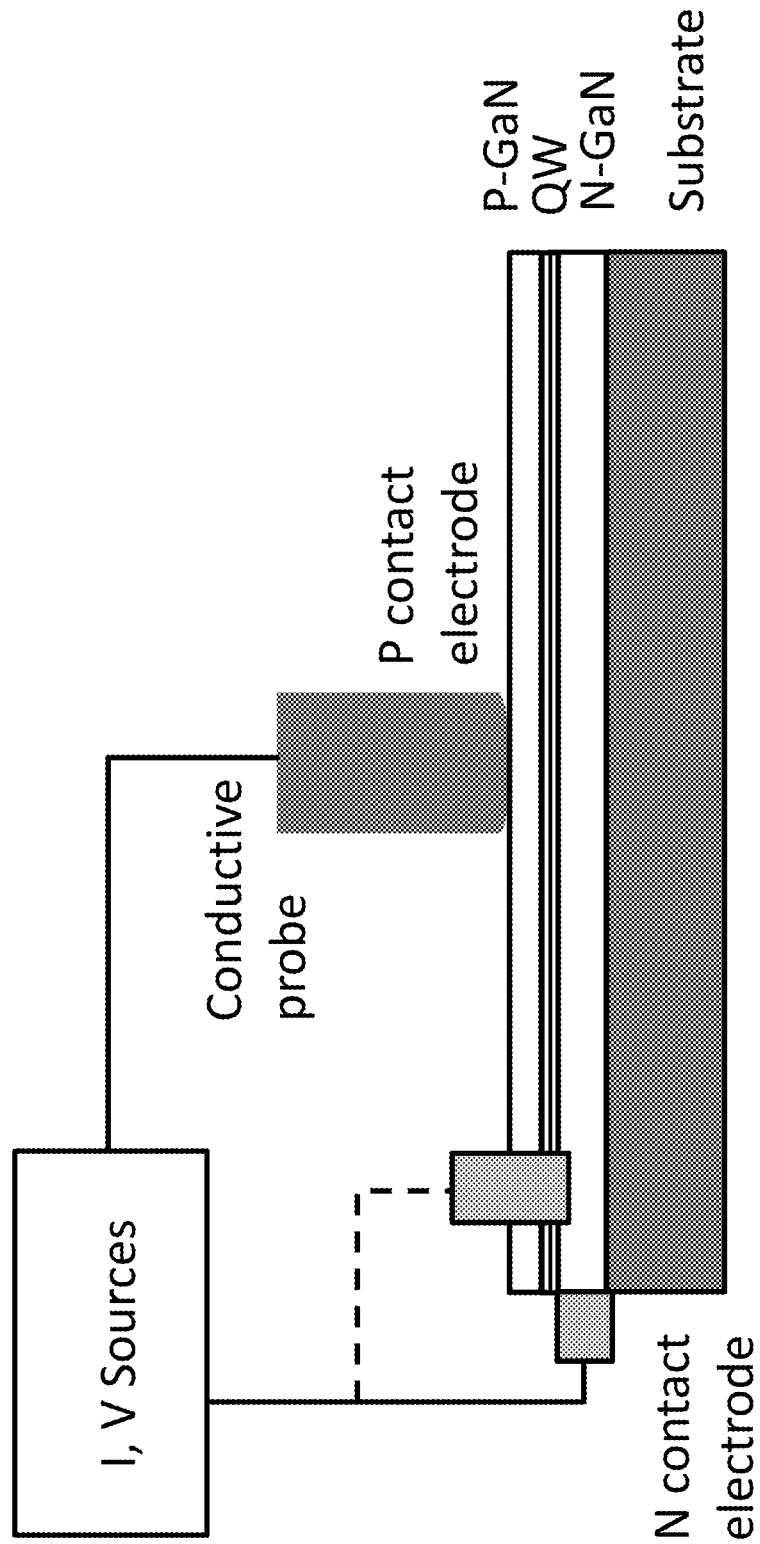
FIG. 1 is a schematic illustration of a conventional probe system used to test light-emitting semiconductor wafers.
Figure 2:
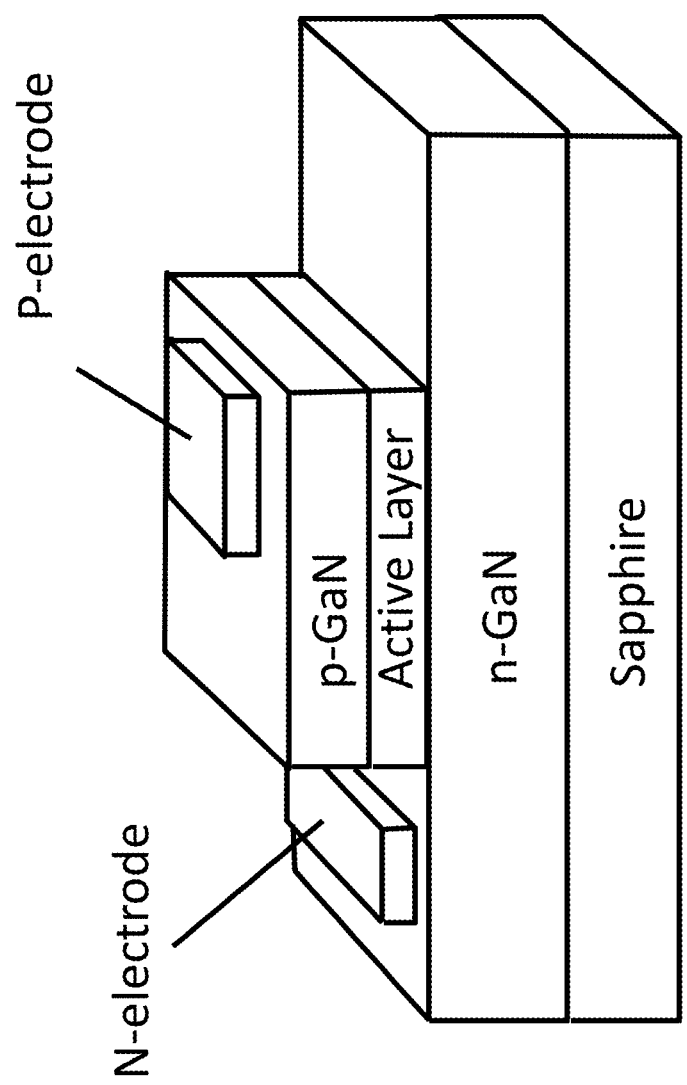
FIG. 2 illustrates the placement of the electrodes in an LED structure.
Figure 3:
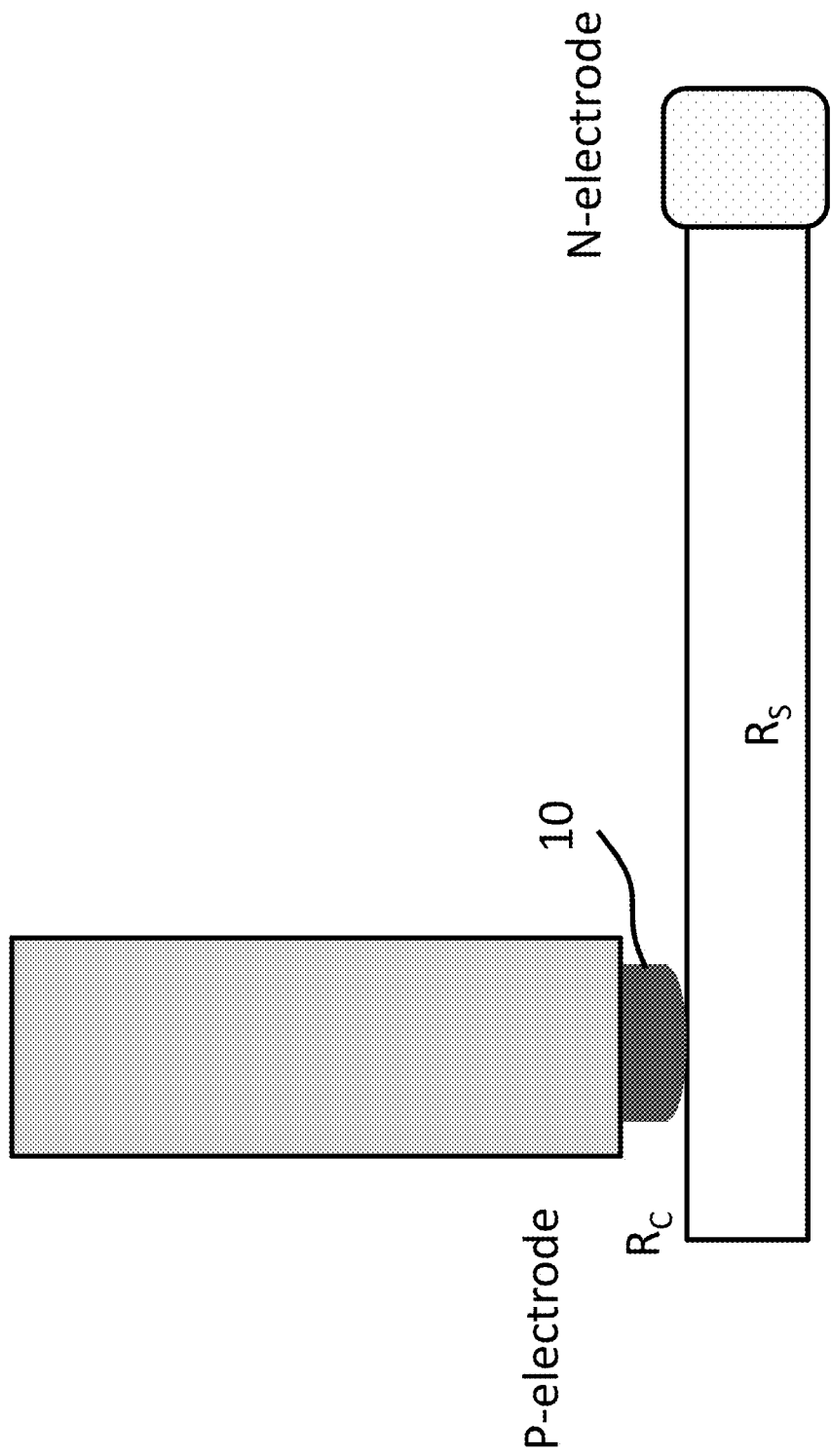
FIG. 3 shows how different test current channels apply during wafer testing based on the position of the probe.
Figure 5:
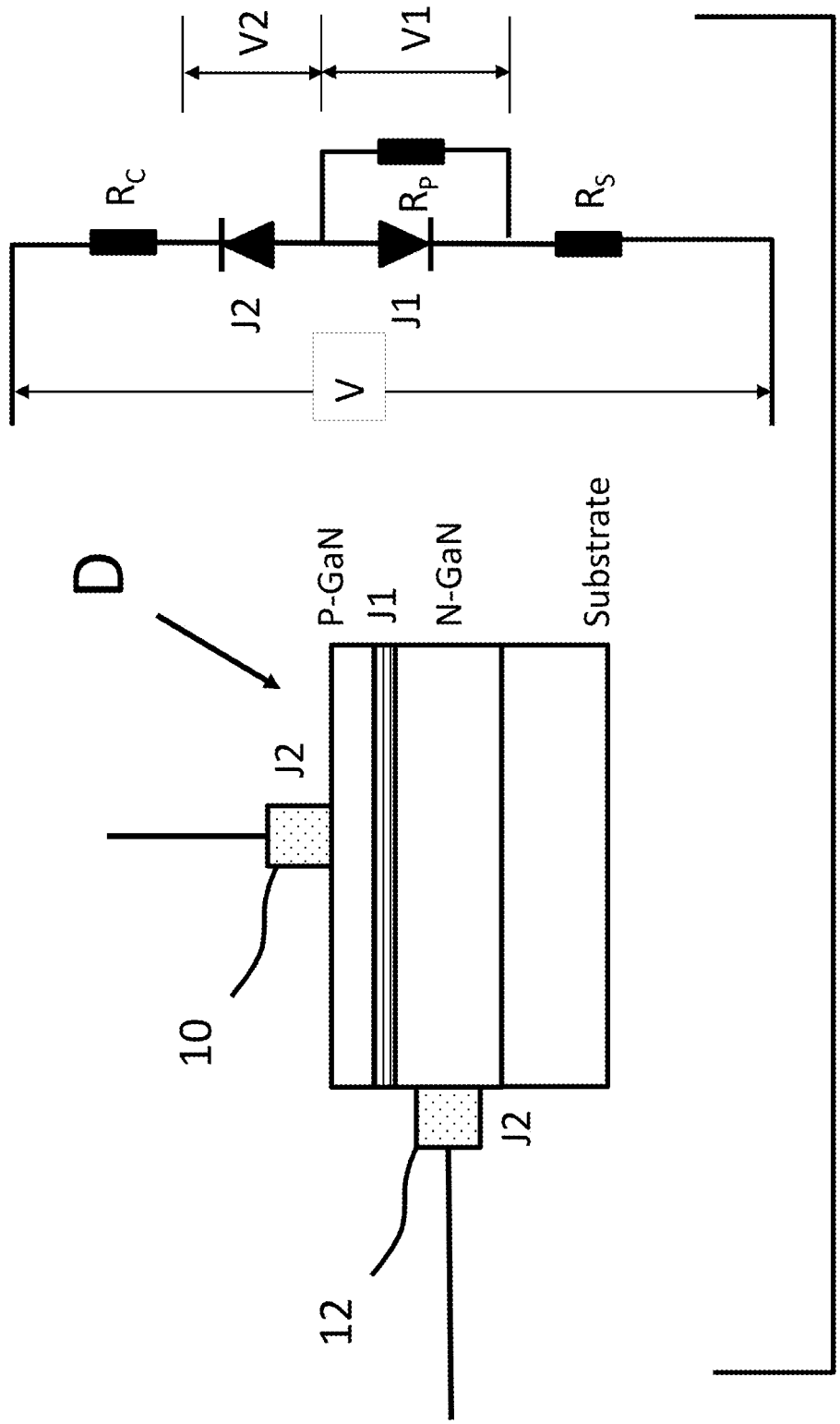
FIG. 5 is a schematic diagram representing the model used according to the invention to simulate a device with the characteristics of the wafer under test.

As mentioned above, at the wafer level the probe is mechanically placed in contact with the surface of the wafer with a certain loading force. The surface roughness of both probe and wafer produce an increase in contact resistance, which is also affected by the distance between the two electrodes when the probe is shifted from location to location between measurements over the wafer surface. The surface contact between the n-electrode and the n-GaN layer (FIG. 3) similarly affect the overall serial resistance of the wafer. In essence, for the purpose of optical/electrical measurement, this is the difference between an actual diode and the wafer structure from which it is produced. FIG. 5 shows a diagram of an equivalent electrical circuit derived from a model proposed by Jay M. Shaw et al. in "Experimental analysis and theoretical model for anomalously high ideality factors (n>>2.0) in AlGaN/GaN p-n junction diodes," Journal of Applied Physics, Volume 94, Number 4, at 2627-2630, hereby incorporated by reference in its entirety. This model was used for the purposes of the invention, but one skilled in the art will recognize that any similar model that fairly represents diode performance and serial resistance could be used in the same manner.

When an LED is tested, the measured forward voltage is the voltage drop across the p-n junction; when the wafer is tested, what is measured is the total voltage drop across the probe, the wafer, and the n-electrode. Therefore, not having any additional understanding of other differences between wafers and related devices, I decided to test whether this additional resistance is what renders wafer-test results inconsistent with the device-test results obtained from the LEDs produced from the wafer. The present invention is based on using a diode model such as the model of FIG. 5 to simulate a device D with the optical/electrical characteristics of the wafer under test, and then subtracting this additional resistance to predict the characteristics of the resulting LEDs.

Referring to the diagram of FIG. 5, the model represents a p-n junction and two metal-semiconductor contacts in series equivalent to a reverse-biased Schottky diode when the current is injected from the p-GaN layer to the n-GaN layer. J1 represents the p-n junction between the p-GaN and n-GaN layers, and J2 represents the two serial metal-semiconductor junctions between the conductive probe 10 and the p-GaN layer and between the n-electrode 12 and the n-GaN layer; $R_C$ is the resistance of the probe; $R_S$ is the serial resistance in the wafer; and $R_P$ is the parallel resistance across the p-n junction. As one skilled in the art will readily understand, when current is injected from the probe 10, because of the doping of the semiconductor material J1 is under forward bias and J2 is under reverse bias. The commonly used diode equation is $$I(V) = I_0 \exp\left(\frac{qV}{nkT}\right)\left[1 - \exp\left(-\frac{qV}{kT}\right)\right]$$

where V is the voltage across the diode, I is the resulting current through the diode, q is the charge of an electron, k is the Boltzmann's constant, T is temperature, n is the diode's ideality factor, and $I_0$ is the diode's reverse saturation current.

Applying this equation to each junction and assuming V>>kT/q (which is normally the case for conventional diode applications), the equation for the current through J1 (the forward p-n junction) becomes $$I_{J1} = I_{01} \exp\left(\frac{qV_1}{n_1 kT}\right)\left[1 - \exp\left(-\frac{qV_1}{kT}\right)\right] \approx I_{01} \exp\left(\frac{qV_1}{n_1 kT}\right). \qquad (1)$$

Similarly, the equation for the current through the reverse metal-semiconductor junction $J_2$ becomes $$I_{J2} = I_{02} \exp\left(\frac{-qV_2}{n'kT}\right) - I_{02} \exp\left(\frac{-qV_2}{n'kT} + \frac{qV_2}{kT}\right) \approx -I_{02} \exp\left(\frac{qV_2}{kTn_2}\right) \qquad (2)$$

where n' is the reverse bias ideality factor of second junction, $J_2$, noting that $n_2 = n'/(n'-1)$.

From Equations 1 and 2, it can be shown that $$\ln I_{Ji} = \frac{q}{kT \sum n_i} V_d + \frac{\sum n_i \ln I_{0i}}{\sum n_i}; \text{ and} \qquad (3)$$

$$V_d = \sum V_i \qquad (4)$$

where i=1,2, $V_d$ is the forward voltage applied across the two junctions (J1, J2) representing the LED in the model of FIG. 5. Noting that $I_{J1} = I_{J2}$ $$\ln I = \frac{q}{kT \sum n_i} V_d + \frac{\sum n_i \ln I_{0i}}{\sum n_i} = \frac{q}{kTn} V_d + \ln I_0 \qquad (5)$$

where the quantities $\sum n_i = n$ and $\frac{\sum n_i \ln I_{0i}}{\sum n_i} = \ln I_0$ are constants. $\qquad (6)$ Therefore, the two junctions can be considered equivalent to one diode with an ideality factor n that is the sum of the ideality factors of the junctions and with the equivalent reverse saturation current $I_0$ given by Equation 6.

Assuming that the total serial resistance R across the wafer is the sum of the wafer serial resistance $R_S$ and the probe-wafer contact resistance $R_C$, $R = R_S + R_C$. In addition, taking into consideration the parallel resistance $R_P$ across the p-n junction, the model becomes $$I - \frac{V - IR}{R_P} = I_0 \exp\left(\frac{q(V - IR)}{nkT}\right) \qquad (7)$$

where $V = V_d + IR$, V is the forward voltage applied to the wafer during the measurement, and $V_d$ is the forward voltage across the two junctions (J1, J2) that the model predicts to correspond to the forward voltage that would be measured across a device produced from the wafer when the current I is injected into it.

Based on the model of Equation 7, two different approaches were followed to predict the $I$-$V_d$ curve of a device from wafer measurements according to the invention, depending on the assumption made with regard to the relation between the injected current I and the serial and parallel resistances R and $R_P$. When R is not large and the surface of the wafer is relatively smooth (for example, with a roughness less than 2 nm Ra), R can be assumed constant (i.e., independent of the injection current) and $R_P \rightarrow \infty$ in the absence of leakage. In such case, Equation 8 becomes $$I = I_0 \exp\left(\frac{q(V-IR)}{nkT}\right) \quad (8)$$

Thus, the three parameters, $I_0$, n and R, can be calculated by using as little as three wafer measurement data points $(I_i, V_i)$, i=1 . . . 3 . . . , as follows (see Lumileds Lighting, LLC, Publication No. AB20-3A, November 2002, hereby also incorporated by reference):

$$n = \frac{I_3(V_2 - V_1) - I_2(V_3 - V_1) + I_1(V_3 - V_2)}{\frac{kT}{q}\left[I_3 \ln\left(\frac{I_2}{I_1}\right) - I_2 \ln\left(\frac{I_3}{I_1}\right) + I_1 \ln\left(\frac{I_3}{I_2}\right)\right]} \quad (9)$$

$$R = \frac{V_3 \ln\left(\frac{I_2}{I_1}\right) - V_2 \ln\left(\frac{I_3}{I_1}\right) + V_1 \ln\left(\frac{I_3}{I_2}\right)}{I_3 \ln\left(\frac{I_2}{I_1}\right) - I_2 \ln\left(\frac{I_3}{I_1}\right) + I_1 \ln\left(\frac{I_3}{I_2}\right)} \quad (10)$$

$$I_0 = \frac{I_1}{\exp\left(\frac{V_1 - RI_1}{\frac{kT}{q}n}\right)} \quad (11)$$

Once the three parameters n, R and $I_0$ are so determined, the corresponding model current I for the wafer (the conventional I-V curve) can be calculated from Equation 8. Then, the predicted forward voltage $V_d$ expected to be measured across the device manufactured from the wafer under test (i.e., the equivalent diode) when subjected to the current I can be calculated by $$V_d = V - IR \quad (12)$$

Figure 6:
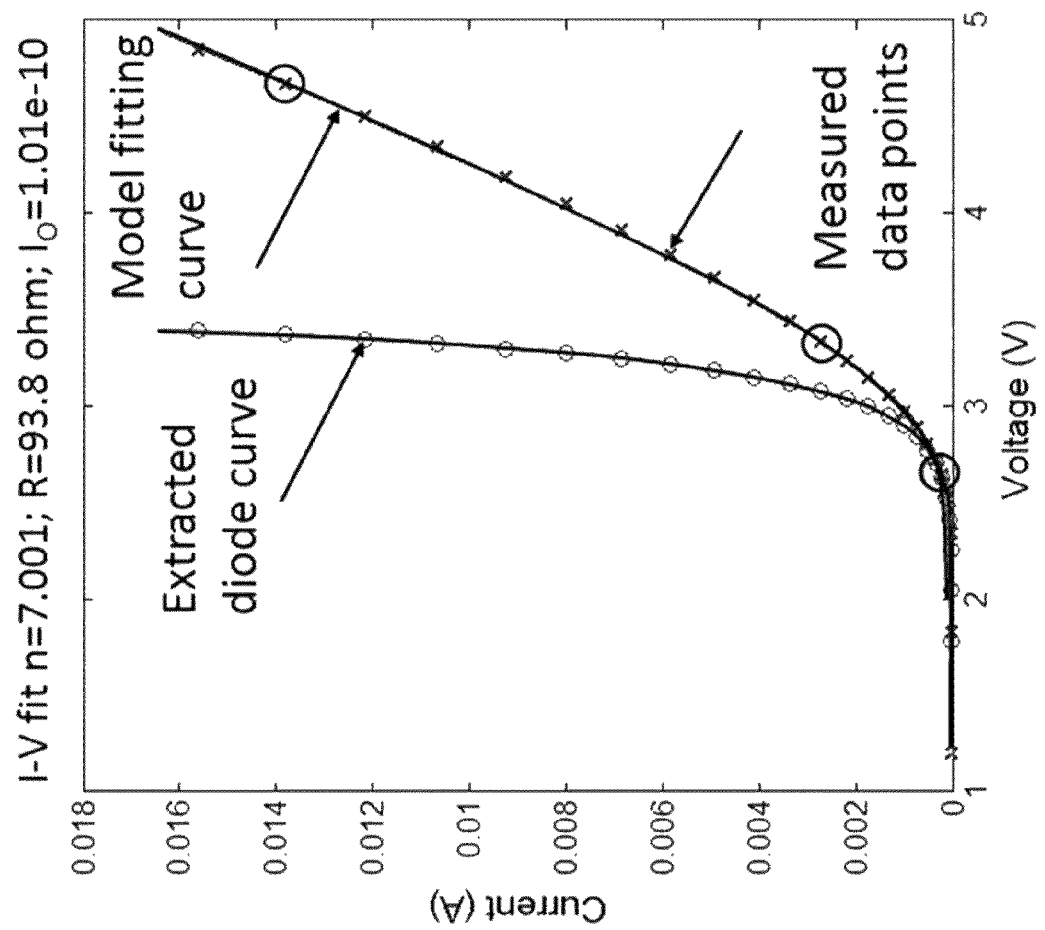
FIG. 6 illustrates the predicted I-V curve for an LED generated by the invention based on a diode model fitted with measurement data obtained from a wafer when the wafer's serial resistance is assumed constant.

Using Equation 12, the predicted points of the I-$V_d$ curve of the diode can be derived from the I-V curve measured for the wafer simply by subtracting the influence of the serial resistance R. FIG. 6 shows an example of such predicted points and the corresponding I-$V_d$ curve derived according to the invention. The measured data (the cross-marked points on the right side of the figure) were obtained from an EL wafer probe setup where the conductive probe was made of a soft conducting material. The three data points used to calculate n, R and $I_0$ are encircled. The resulting fitted I-V curve for the wafer is shown through these measurement data points. The predicted diode data points, shown as circles on the left, were derived by subtracting from the measured data points the total serial resistance contribution using Equation 12. The resulting I-$V_d$ curve on the left of the figure was obtained by fitting the predicted diode data points. The figure shows an I-$V_d$ curve that is much more realistic for an LED than the wafer I-V curve produced by measurements, including a predicted turn-on diode voltage of about 3 volts, which is typical for forward-bias Gallium-Nitride LEDs. This shows that the use of the diode model as taught by the invention to predict the I-$V_d$ curve of LEDs from wafer measurements produces useful results.

Figure 7:
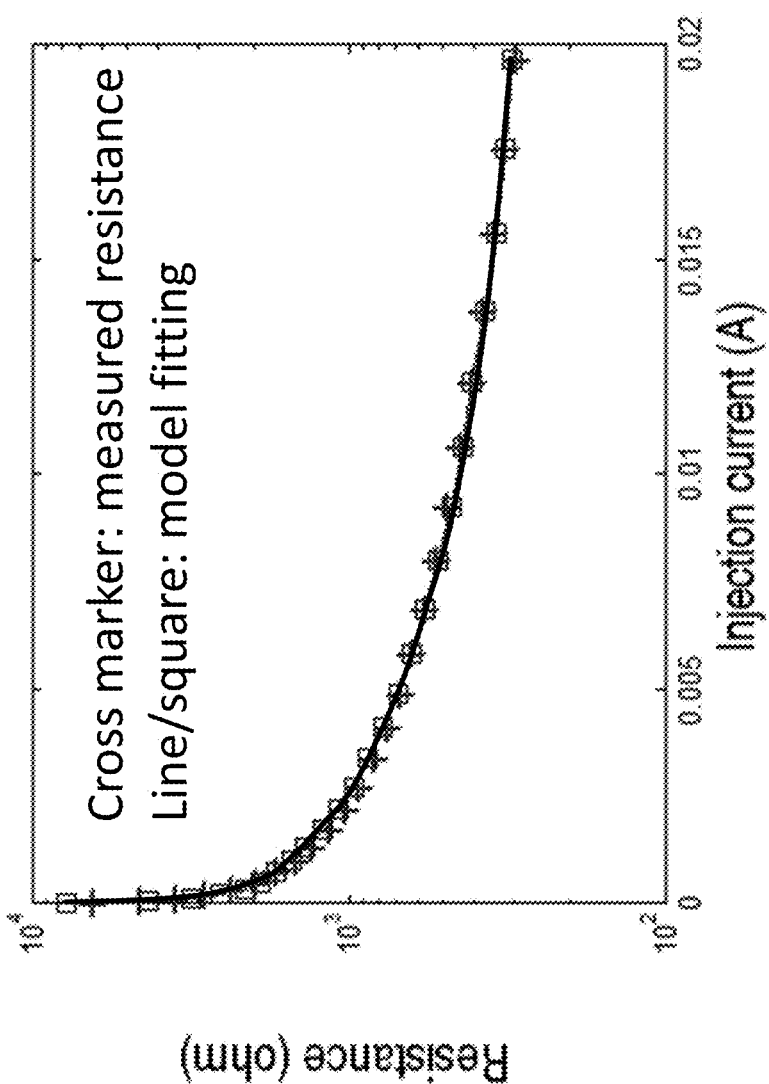
FIG. 7 illustrates a resistance-versus-current curve generated by the invention for use in predicting the I-V curve of an LED from wafer measurements when the wafer's serial resistance is assumed to be current dependent.

When the resistance varies with the injection current, it becomes necessary to also model the resistance as a function of injection current. The resistance can be calculated in conventional manner at any point along the measured I-V curve as its slope, that is, numerically, as $$R = \frac{\Delta V}{\Delta I} \quad (13)$$

where R is the total resistance across the wafer. FIG. 7 illustrates such a resistance versus injection-current plot so calculated from the measured I-V data shown in FIG. 8. However, in order to utilize such resistance information for the purposes of producing a complete I-$V_d$ curve, it is necessary to model it with an equation that can then be combined with Equation 12 to yield the I-$V_d$ curve of interest. For example, I found that the following equation represents a workable model for the plot of FIG. 7:

$$R = \frac{\alpha}{I^\beta} + C \quad (14)$$

where $\alpha$, $\beta$, and C are constant parameters. Accordingly, a conventional least-square multi-parameter process may be used to minimize the following equation over all data points i (i=1, 2, . . . N), $$\Sigma(\alpha, \beta, C) = \sum_{i=1}^{N}\left(\ln(R_i) - \ln\left(\frac{\alpha}{I_i^\beta} + C\right)\right)^2 \quad (15)$$

thereby producing an estimate of $\alpha$, $\beta$ and C, from which R can be calculated for any value of I. Then Equations 8 (again assuming no leakage) and 12 provide the means for calculating the predicted diode voltage data points $V_d$ corresponding to each measured data point, as illustrated above.

However, as in the previous case, it would be desirable to have an algorithm that also produces an estimate of the ideality factor n and the reverse saturation current $I_0$ from the measurement data. This can be achieved again by using Equation 8 that includes n and $I_0$ as constant parameters (again assuming no leakage). The combination of Equation 8 with Equation 14, where $V_d = V - IR$, solved for both voltage and current yields the following set of three equations having $\alpha$, $\beta$, C, n and $I_0$ as parameters:

$$R_i = \frac{\alpha}{I_i^\beta} + C \quad (16)$$

$$I(i) = I_0 \exp\left(\frac{q(V_i - I_i R_i)}{nkT}\right)$$

$$V_d(i) = I_i R_i + \frac{kT}{q} n \ln\left(\frac{I_i}{I_0} + 1\right)$$

Figure 8:
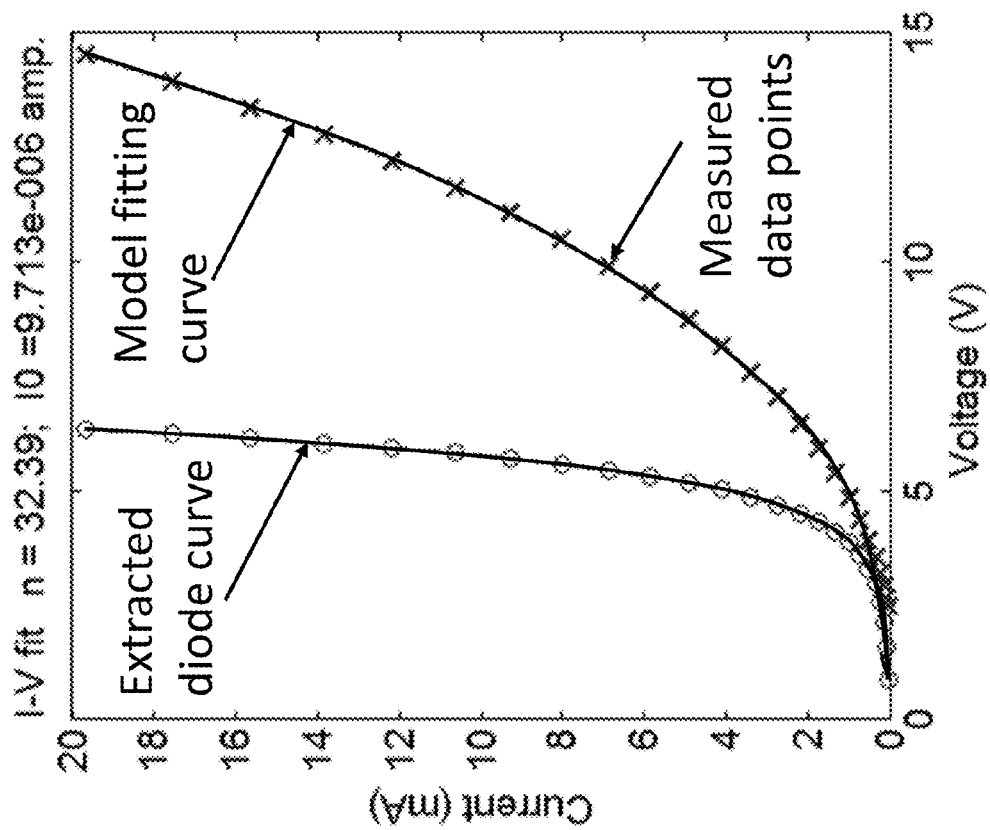
FIG. 8 illustrates the predicted I-V curve for an LED with the resistance characteristics of FIG. 7 based on measurement data obtained from a wafer when the wafer's serial resistance is assumed to be current dependent.

Therefore, the parameters $\alpha$, $\beta$, C, n and $I_0$ can be estimated by fitting the set of Equations 16 to the measured data with a multi-parameter minimization calculation of an estimator such as, for example, $$\Sigma(\alpha, \beta, C, n, I_0) = \sum_{i=1}^{N}\left[w_i(I_i - I_{Mi})^2 + \frac{1}{w_i}(V_i - V_{Mi})^2\right] \quad (17)$$

where $I_i$, $V_i$ and $R_i$ are represented by Equations 16, M refers to measured data points and $w_i$ is an empirical weight factor that accounts for the increased sensitivity of the I-V curve to current at high current values and to voltage at low current values. Once these parameters are so calculated, Equations 16 yield directly the predicted I-$V_d$ curve for the devices manufactured from the measured wafer according to the invention. The plots in FIG. 8 illustrate both the measured data points (cross marked), the model fitting curve obtained from the measured data points, the predicted diode data points shown in circles, and the predicted I-$V_d$ curve obtained from Equations 16. The figure, which is based on a different material with a much rougher surface (greater than 7 nm Ra) that the material from which FIG. 6 was derived, again shows an LED I-$V_d$ curve that is much more realistic than the I-V curve of the wafer.

When the serial resistance of the sample is substantially constant, the minimization process based on measurement data drives β to zero, which in turn results in R=α+C, two parameters independent of current. Thus, it is worth noting that in such case Equations 16 reduce to Equation 8, the equation used above for the constant-resistance case.

Thus, a novel approach has been shown for the characterization of semiconductor devices from measurements carried out on the wafer from which they are produced. The results show that the current-voltage curve so predicted for the devices, the main characterization information used in the art, is realistically much closer to the expected curve than any result previously produced from wafer measurements. In addition, the approach of the invention provides a predicted measure of the device's ideality factor and reverse saturation current.

Figure 9:
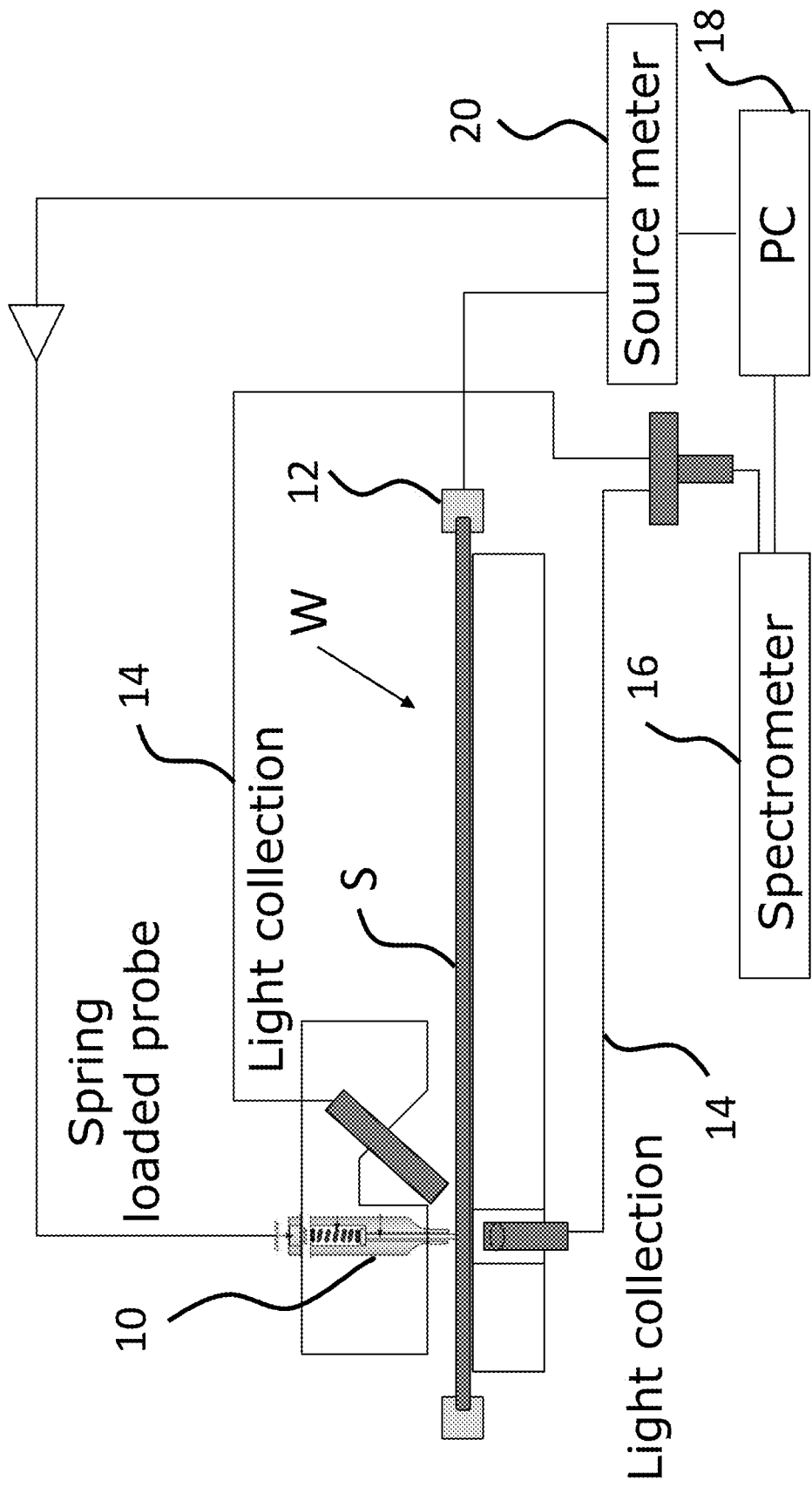
FIG. 9 illustrates a probe station for light-emitting epi-wafer characterization as used during the development work that produced the invention.

The invention can be implemented with existing probe systems, such as illustrated in FIG. 9, where a spring-loaded probe 10 is used as an anode electrode. The probe is engaged to the surface S of the wafer W and makes a contact to the p-GaN layer. The contact of the cathode 12 is made at the side edge of the wafer so that the n-GaN layer can be accessed. The two electrodes 10,12 together with the epi-wafer form a temporary LED structure. When current is injected into the wafer from the probe 10, luminescence under the probe occurs and the emitted light is collected from sensors both in the front and back sides of the wafer through optical fibers 14 and a spectrometer 16. The data output of the spectrometer is acquired by a computer processor 18 for analysis and display. A current source 20 controls the level of current injected into the wafer W. According to the invention, the processor 18 is appropriately programmed to carry out the measuring, fitting, and calculating functions described above, and to generate (in display or other form) the characterization information produced by the invention.

Various changes in the details that have been described may be made by those skilled in the art within the principles and scope of the invention herein illustrated and defined in the appended claims. For example, the invention has been described in terms of wafer measurements to predict LED characterization parameters, but it is understood that it can be used in the same manner to characterize other semiconductor devices from measurements taken at the wafer level. Similarly, it is anticipated that the I-V data and luminescence intensity from wafer measurements could be used to model other LED properties, such as internal quantum effects. Thus, while the invention has been shown and described in what are believed to be the most practical and preferred embodiments, it is recognized that departures can be made therefrom within the scope of the invention, which is not to be limited to the details disclosed herein but is to be accorded the full scope of the claims so as to embrace any and all equivalent apparatus and methods.

The invention claimed is:

1. A method of characterizing a semiconductor device from conductive-probe measurements performed on a semiconductor wafer from which the device is manufactured, said wafer including a p-type semiconductor layer and an n-type semiconductor layer defining a p-n junction, the method comprising the following steps:
   applying electrical stimuli to the wafer through a probe in direct contact with one of said semiconductor layers to produce conductive-probe measurement data;
   fitting a current-voltage curve (I-V) model to said conductive-probe measurement data, said model expressing a current-voltage relationship as a function of resistance; and
   estimating a current-voltage curve (I-$V_d$) for the device by removing from the (I-V) model resistance effects calculated from data generated by the fitting step;
   wherein the resistance is assumed variable with current and the resistance is calculated from measurement data points from the equation:

$$R = \frac{\Delta V}{\Delta I}$$

where R is resistance, V is voltage, and I is current;
   wherein the device's forward voltage, ideality factor, resistance and reverse saturation current are calculated from the following set of equations:

$$R_i = \frac{\alpha}{I_i^\beta} + C$$

$$I(i) = I_0 \exp\left(\frac{q(V_i - I_i R_i)}{nkT}\right)$$

$$V_d(i) = I_i R_i + \frac{kT}{q} n \ln\left(\frac{I_i}{I_0} + 1\right)$$

where $V_d$ is the device's forward voltage, $I_0$ is reverse saturation current, n is ideality factor, and α, β, and C are constant parameters estimated by fitting N current-voltage measurement data points, $(I_i, V_i)$, i=1K N, with a multi-parameter minimization calculation; and
   wherein said multi-parameter minimization calculation is carried out with the following estimator:

$$\Sigma(\alpha, \beta, C, n, I_0) = \sum_{i=1}^{N} \left[ w_i (I_i - I_{Mi})^2 + \frac{1}{w_i}(V_i - V_{Mi})^2 \right]$$

where $M_i$ refers to said measurement data points, and $w_i$ is an empirical weight factor that accounts for the increased sensitivity of the current-voltage curve for the device to current at high current values and to voltage at low current values.

2. The method of claim 1, wherein said model includes a parameter of interest that is produced by the fitting step.

3. The method of claim 2, wherein the parameter of interest is an ideality factor.

4. The method of claim 2, wherein the parameter of interest is a reverse saturation current.

5. The method of claim 1, wherein, rather than variable with current, the resistance is assumed constant and the model has the following form:

$$I = I_0 \exp\left(\frac{q(V-IR)}{nkT}\right)$$

where I is current, $I_0$ is reverse saturation current, n is ideality factor, R is resistance, q is electron charge, k is Boltzmann's constant, and T is temperature.

6. The method of claim 5, wherein the ideality factor, resistance and reverse saturation current are calculated from the following set of equations and at least three current-voltage measurement data points $(I_i, V_i)$, i=1K 3 . . .

$$n = \frac{I_3(V_2-V_1) - I_2(V_3-V_1) + I_1(V_3-V_2)}{\frac{kT}{q}\left[I_3\ln\left(\frac{I_2}{I_1}\right) - I_2\ln\left(\frac{I_3}{I_1}\right) + I_1\ln\left(\frac{I_3}{I_2}\right)\right]}$$

$$R = \frac{V_3\ln\left(\frac{I_2}{I_1}\right) - V_2\ln\left(\frac{I_3}{I_1}\right) + V_1\ln\left(\frac{I_3}{I_2}\right)}{I_3\ln\left(\frac{I_2}{I_1}\right) - I_2\ln\left(\frac{I_3}{I_1}\right) + I_1\ln\left(\frac{I_3}{I_2}\right)}$$

$$I_0 = \frac{I_1}{\exp\left(\frac{V_1 - RI_1}{\frac{kT}{q}n}\right)}.$$

7. The method of claim 1, wherein said semiconductor device is a light emitting diode.

8. Apparatus for characterizing a semiconductor device from conductive-probe measurements performed on a semiconductor wafer from which the device is manufactured, said wafer including a p-type semiconductor layer and an n-type semiconductor layer defining a p-n junction, comprising:
 a conductive probe adapted to contact directly a surface of one of said semiconductor layers of the wafer for characterization measurements by electrical stimulation;
 an electrode adapted for electrical connection to another of said semiconductor layers of the wafer;
 a power source capable of applying electrical stimuli to said wafer through the probe and the electrode; and
 a processor that includes means for characterizing the wafer based on current-voltage measurement data produced by said electrical stimuli;
 wherein said characterizing means includes means for:
  fitting a current-voltage curve (I-V) model to said measurement data, said model expressing a current-voltage relationship as a function of resistance; and for
  estimating a current-voltage curve (I-$V_d$) for the device by removing from the (I-V) model resistance effects calculated from data generated by the fitting means;
 wherein the resistance is assumed variable with current and the resistance is calculated from measurement data points from the equation:

$$R = \frac{\Delta V}{\Delta I}$$

where R is resistance, V is voltage, and I is current;
 wherein the device's forward voltage, ideality factor, resistance and reverse saturation current are calculated from the following set of equations:

$$R_i = \frac{\alpha}{I_i^\beta} + C$$

$$I(i) = I_0 \exp\left(\frac{q(V_i - I_i R_i)}{nkT}\right)$$

$$V_d(i) = I_i R_i + \frac{kT}{q} n \ln\left(\frac{I_i}{I_0} + 1\right)$$

where $V_d$ is the device's forward voltage, $I_0$ is reverse saturation current, n is ideality factor, and $\alpha$, $\beta$, and C are constant parameters estimated by fitting N current-voltage measurement data points, $(I_i, V_i)$, i=1K N, with a multi-parameter minimization calculation; and
 wherein said multi-parameter minimization calculation is carried out with the following estimator:

$$\Sigma(\alpha, \beta, C, n, I_0) = \sum_{i=1}^{N}\left[w_i(I_i - I_{Mi})^2 + \frac{1}{w_i}(V_i - V_{Mi})^2\right]$$

where $M_i$ refers to said measurement data points, and $w_i$ is an empirical weight factor that accounts for the increased sensitivity of the current-voltage curve for the device to current at high current values and to voltage at low current values.

9. The apparatus of claim 8, wherein said model includes a parameter of interest that is produced by the fitting step.

10. The apparatus of claim 9, wherein the parameter of interest is an ideality factor.

11. The apparatus of claim 9, wherein the parameter of interest is a reverse saturation current.

12. The apparatus of claim 8, wherein, rather than variable with current, the resistance is assumed constant and the model has the following form:

$$I = I_0 \exp\left(\frac{q(V-IR)}{nkT}\right)$$

where I is current, $I_0$ is reverse saturation current, n is ideality factor, R is resistance, q is electron charge, k is Boltzmann's constant, and T is temperature.

13. The apparatus of claim 12, wherein the ideality factor, resistance and reverse saturation current are calculated from the following set of equations and at least three current-voltage measurement data points $(I_i, V_i)$, i=1K 3 . . .

$$n = \frac{I_3(V_2-V_1) - I_2(V_3-V_1) + I_1(V_3-V_2)}{\frac{kT}{q}\left[I_3\ln\left(\frac{I_2}{I_1}\right) - I_2\ln\left(\frac{I_3}{I_1}\right) + I_1\ln\left(\frac{I_3}{I_2}\right)\right]}$$

$$R = \frac{V_3\ln\left(\frac{I_2}{I_1}\right) - V_2\ln\left(\frac{I_3}{I_1}\right) + V_1\ln\left(\frac{I_3}{I_2}\right)}{I_3\ln\left(\frac{I_2}{I_1}\right) - I_2\ln\left(\frac{I_3}{I_1}\right) + I_1\ln\left(\frac{I_3}{I_2}\right)}$$

$$I_0 = \frac{I_1}{\exp\left(\frac{V_1 - RI_1}{\frac{kT}{q}n}\right)}.$$

14. The apparatus of claim 8, wherein said semiconductor device is a light emitting diode.

15. Non-transitory computer readable medium containing computer instructions stored therein for causing a computer processor to perform the steps of applying electrical stimuli to a semiconductor wafer, said wafer having a p-type semiconductor layer and an n-type semiconductor layer defining a p-n junction, through a probe in direct contact with one of said semiconductor layers to produce conductive-probe measurement data; fitting a current-voltage curve (I-V) model to said conductive-probe measurement data, said model expressing a current-voltage relationship as a function of resistance; and estimating a current-voltage curve (I-$V_d$) for a semiconductor device manufactured from the wafer by removing from the (I-V) model resistance effects calculated from data generated by fitting the current-voltage curve (I-V) model to the conductive-probe measurement data from the wafer;

wherein the resistance is assumed variable with current and the resistance is calculated from measurement data points from the equation:

$$R = \frac{\Delta V}{\Delta I}$$

where R is resistance, V is voltage, and I is current;

wherein the device's forward voltage, ideality factor, resistance and reverse saturation current are calculated from the following set of equations:

$$R_i = \frac{\alpha}{I_i^\beta} + C$$

$$I(i) = I_0 \exp\left(\frac{q(V_i - I_i R_i)}{nkT}\right)$$

$$V_d(i) = I_i R_i + \frac{kT}{q} n \ln\left(\frac{I_i}{I_0} + 1\right)$$

where $V_d$ is the device's forward voltage, $I_0$ is reverse saturation current, n is ideality factor, and $\alpha$, $\beta$, and C are constant parameters estimated by fitting N current-voltage measurement data points, $(I_i, V_i)$, i=1K N, with a multi-parameter minimization calculation; and wherein said multi-parameter minimization calculation is carried out with the following estimator:

$$\Sigma(\alpha, \beta, C, n, I_0) = \sum_{i=1}^{N}\left[w_i(I_i - I_{Mi})^2 + \frac{1}{w_i}(V_i - V_{Mi})^2\right]$$

where M refers to said measurement data points, and $w_i$ is an empirical weight factor that accounts for the increased sensitivity of the current-voltage curve for the device to current at high current values and to voltage at low current values.

16. The computer readable medium of claim 15, wherein said model includes a parameter of interest that is produced by fitting the current-voltage curve (I-V) model to the conductive-probe measurement data from the wafer.

17. The computer readable medium of claim 16, wherein the parameter of interest is an ideality factor.

18. The computer readable medium of claim 16, wherein the parameter of interest is a reverse saturation current.

19. The computer readable medium of claim 15, wherein, rather than variable with current, the resistance is assumed constant and the model has the following form:

$$I = I_0 \exp\left(\frac{q(V - IR)}{nkT}\right)$$

where I is current, $I_0$ is reverse saturation current, n is ideality factor, R is resistance, q is electron charge, k is Boltzmann's constant, and T is temperature.

20. The computer readable medium of claim 19, wherein the ideality factor, resistance and reverse saturation current are calculated from the following set of equations and at least three current-voltage measurement data points $(I_i, V_i)$, i=1K 3 ...

$$n = \frac{I_3(V_2 - V_1) - I_2(V_3 - V_1) + I_1(V_3 - V_2)}{\frac{kT}{q}\left[I_3 \ln\left(\frac{I_2}{I_1}\right) - I_2 \ln\left(\frac{I_3}{I_1}\right) + I_1 \ln\left(\frac{I_3}{I_2}\right)\right]}$$

$$R = \frac{V_3 \ln\left(\frac{I_2}{I_1}\right) - V_2 \ln\left(\frac{I_3}{I_1}\right) + V_1 \ln\left(\frac{I_3}{I_2}\right)}{I_3 \ln\left(\frac{I_2}{I_1}\right) - I_2 \ln\left(\frac{I_3}{I_1}\right) + I_1 \ln\left(\frac{I_3}{I_2}\right)}$$

$$I_0 = \frac{I_1}{\exp\left(\frac{V_1 - RI_1}{\frac{kT}{q}n}\right)}.$$

21. The computer readable medium of claim 15, wherein said semiconductor device is a light emitting diode.

\* \* \* \* \*